(12) United States Patent
Dosdos et al.

(10) Patent No.: US 8,362,609 B1
(45) Date of Patent: Jan. 29, 2013

(54) INTEGRATED CIRCUIT PACKAGE AND METHOD OF FORMING AN INTEGRATED CIRCUIT PACKAGE

(75) Inventors: S. Gabriel R. Dosdos, San Jose, CA (US); Dong Wook Kim, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 396 days.

(21) Appl. No.: 12/607,019

(22) Filed: Oct. 27, 2009

(51) Int. Cl.
H01L 23/04 (2006.01)

(52) U.S. Cl. . 257/730; 257/690; 257/704; 257/E21.499; 438/121

(58) Field of Classification Search ........... 257/730, 257/690, 704, E21.499
See application file for complete search history.

(56) References Cited

U.S. PATENT DOCUMENTS

| | | | |
|---|---|---|---|
| 3,846,824 A | 11/1974 | Bell | |
| 3,972,062 A | 7/1976 | Hopp | |
| 4,541,005 A | 9/1985 | Hunter et al. | |
| 4,748,538 A | 5/1988 | Tsuji | |
| 4,849,856 A | 7/1989 | Funari et al. | |
| 5,028,984 A | 7/1991 | Ameen et al. | |
| 5,031,025 A | 7/1991 | Braun et al. | |
| 5,105,529 A | 4/1992 | McShane et al. | |
| 5,168,432 A | 12/1992 | Murphy et al. | |
| 5,206,792 A | 4/1993 | Reynolds | |
| 5,258,576 A | 11/1993 | Neumann et al. | |
| 5,289,337 A | 2/1994 | Aghazadeh et al. | |
| 5,297,333 A | 3/1994 | Kusaka | |
| 5,406,117 A | 4/1995 | Dlugokecki et al. | |
| 5,434,745 A | 7/1995 | Shokrgozar et al. | |
| 5,436,407 A | 7/1995 | Fehr et al. | |
| 5,455,456 A | 10/1995 | Newman | |
| 5,459,352 A | 10/1995 | Layton et al. | |
| 5,473,814 A | 12/1995 | White | |
| 5,504,652 A | 4/1996 | Foster et al. | |
| 5,533,256 A | 7/1996 | Call et al. | |

(Continued)

FOREIGN PATENT DOCUMENTS

| | | |
|---|---|---|
| JP | 58140931 | 2/1985 |
| JP | 60031253 A2 | 2/1985 |

(Continued)

OTHER PUBLICATIONS

Emoto, Y., et al., "Development of Molded TAB Package Technology," Nippon Steel Technical Report, No. 56, Jan. 1993, pp. 1-6.

(Continued)

*Primary Examiner* — Zandra Smith
*Assistant Examiner* — Paul Patton
(74) *Attorney, Agent, or Firm* — John J. King

(57) ABSTRACT

An integrated circuit package is described. The integrated circuit package comprises a substrate having a plurality of sides, where each pair of adjacent sides forms a corner; a die coupled to a first surface of the substrate; a lid having a first portion positioned over the die and a plurality of foot portions, each foot portion of the plurality of foot portions being coupled to the first surface of the substrate at a corresponding corner of the substrate, where a side of the integrated circuit package above the substrate and between two associated foot portions has an opening; and a plurality of contact elements coupled to a second surface of the substrate. A method of forming an integrated circuit package is also shown.

20 Claims, 4 Drawing Sheets

U.S. PATENT DOCUMENTS

| | | | |
|---|---|---|---|
| 5,552,635 A | 9/1996 | Kim et al. |
| 5,583,377 A | 12/1996 | Higgins, III |
| 5,641,987 A | 6/1997 | Lee |
| 5,728,247 A | 3/1998 | Büstrich et al. |
| 5,736,785 A | 4/1998 | Chiang et al. |
| 5,745,344 A | 4/1998 | Baska et al. |
| 5,770,478 A | 6/1998 | Iruvanti et al. |
| 5,825,087 A | 10/1998 | Iruvanti et al. |
| 5,834,839 A | 11/1998 | Mertol |
| 5,849,606 A | 12/1998 | Kikuchi et al. |
| 5,889,323 A | 3/1999 | Tachibana |
| 5,895,233 A | 4/1999 | Higashi et al. |
| 5,898,224 A | 4/1999 | Akram |
| 5,903,436 A | 5/1999 | Brownell et al. |
| 5,949,655 A | 9/1999 | Glenn et al. |
| 5,956,576 A | 9/1999 | Toy et al. |
| 5,990,418 A | 11/1999 | Bivona et al. |
| 5,998,862 A | 12/1999 | Yamanaka |
| 6,016,006 A | 1/2000 | Kolman et al. |
| 6,037,193 A | 3/2000 | Interrante et al. |
| 6,049,656 A | 4/2000 | Kim et al. |
| 6,069,023 A | 5/2000 | Bernier et al. |
| 6,075,289 A | 6/2000 | Distefano |
| 6,104,093 A | 8/2000 | Caletka et al. |
| 6,118,177 A | 9/2000 | Lischner et al. |
| 6,166,434 A | 12/2000 | Desai et al. |
| 6,214,643 B1 | 4/2001 | Chiu |
| 6,225,694 B1 | 5/2001 | Terui |
| 6,225,695 B1 | 5/2001 | Chia et al. |
| 6,249,046 B1 | 6/2001 | Hashimoto |
| 6,262,481 B1 | 7/2001 | Wang et al. |
| 6,271,058 B1 | 8/2001 | Yoshida |
| 6,274,927 B1 | 8/2001 | Glenn |
| 6,288,900 B1 | 9/2001 | Johnson et al. |
| RE37,554 E | 2/2002 | Brunner et al. |
| 6,352,195 B1 | 3/2002 | Guthrie et al. |
| 6,354,485 B1 | 3/2002 | Distefano |
| 6,380,621 B1 | 4/2002 | Ando et al. |
| 6,413,353 B2 | 7/2002 | Pompeo et al. |
| 6,462,405 B1 | 10/2002 | Lai et al. |
| 6,469,897 B2 | 10/2002 | Ho et al. |
| 6,483,702 B1 | 11/2002 | Lofland |
| 6,501,171 B2 | 12/2002 | Farquhar et al. |
| 6,504,096 B2 | 1/2003 | Okubora |
| 6,538,320 B1 | 3/2003 | Tosaya et al. |
| 6,573,590 B1 | 6/2003 | Radu et al. |
| 6,630,743 B2 | 10/2003 | Magnuson et al. |
| 6,670,223 B2 | 12/2003 | Gaynes et al. |
| 6,681,482 B1 | 1/2004 | Lischner et al. |
| 6,693,748 B1 | 2/2004 | Fujimoto et al. |
| 6,713,863 B2 | 3/2004 | Murayama et al. |
| 6,762,796 B1 | 7/2004 | Nakajoh et al. |
| 6,770,513 B1 | 8/2004 | Vikram et al. |
| 6,819,566 B1 | 11/2004 | Danovitch et al. |
| 6,849,942 B2 | 2/2005 | Lin et al. |
| 6,853,068 B1 | 2/2005 | Djekic |
| 6,856,015 B1 | 2/2005 | Huang et al. |
| 6,864,565 B1 | 3/2005 | Hool et al. |
| 6,882,535 B2 | 4/2005 | Labanok et al. |
| 6,919,630 B2 | 7/2005 | Hsiao |
| 6,933,537 B2 | 8/2005 | Yee et al. |
| 6,949,414 B2 | 9/2005 | Lo et al. |
| 6,952,050 B2 | 10/2005 | Kwon et al. |
| 6,953,990 B2 | 10/2005 | Gallup et al. |
| 7,012,326 B1 | 3/2006 | Wu et al. |
| 7,057,276 B2 | 6/2006 | Lin et al. |
| 7,126,217 B2 | 10/2006 | Chiu et al. |
| 7,135,769 B2 | 11/2006 | Ni et al. |
| 7,141,886 B2 | 11/2006 | Dimaano et al. |
| 7,187,077 B1 | 3/2007 | Nagarajan |
| 7,196,414 B2 | 3/2007 | Lin et al. |
| 7,199,467 B2 | 4/2007 | Yoshimura |
| 7,205,651 B2 | 4/2007 | Do et al. |
| 7,327,027 B2 | 2/2008 | Houle et al. |
| 7,342,298 B1 | 3/2008 | Zhang |
| 7,358,106 B2 | 4/2008 | Potter |
| 7,388,284 B1 * | 6/2008 | Zhang .................. 257/704 |
| 7,402,906 B2 | 7/2008 | Rahman Khan et al. |
| 7,429,501 B1 | 9/2008 | Wu et al. |
| 7,473,583 B1 | 1/2009 | Nagarajan |
| 7,554,190 B2 | 6/2009 | Macris et al. |
| 2004/0007780 A1 | 1/2004 | Hundt et al. |
| 2004/0174682 A1 | 9/2004 | Lin et al. |
| 2004/0238947 A1 | 12/2004 | Rumer et al. |
| 2005/0077614 A1 | 4/2005 | Chengalva et al. |
| 2005/0112796 A1 | 5/2005 | Ararao et al. |
| 2005/0168952 A1 | 8/2005 | Chen et al. |
| 2006/0060952 A1 | 3/2006 | Yuan et al. |
| 2008/0001277 A1 | 1/2008 | Wen et al. |
| 2010/0109152 A1 * | 5/2010 | Kariyazaki .................. 257/704 |

FOREIGN PATENT DOCUMENTS

| | | |
|---|---|---|
| JP | 60160146 A | 8/1985 |
| JP | 03048446 | 3/1991 |
| JP | 08211913 | 2/1998 |
| WO | WO 00/69239 | 11/2000 |

OTHER PUBLICATIONS

U.S. Appl. No. 12/828,166, filed Jun. 30, 2010, Zohni et al., Xilinx, Inc., 2100 Logic Drive, San Jose, CA, 95124 USA.

Pecht, Michael, "Handbook of Electronic Package Design", Section 5.4, Aug. 16, 1991, 256-257 pp., Marcel Dekker, Inc., NY, NY, USA.

Xilinx, Inc., "The Programmable Logic Data Book 1999," pp. 1-62, available from Xilinx, Inc., 2100 Logic Drive, San Jose, California 95124.

U.S. Appl. No. 10/648,118, filed Aug. 25, 2003, Chee, et al., Xilinx, Inc., 2100 Logic Drive, San Jose, CA 95124.

U.S. Appl. No. 11/123,499, filed May 5, 2005, Hoang, Lan H., Xilinx, Inc., 2100 Logic Drive, San Jose, CA 95124.

U.S. Appl. No. 11/823,376, filed Jun. 26, 2007, Dosdos, et al., Xilinx, Inc., 2100 Logic Drive, San Jose, CA 95124.

\* cited by examiner

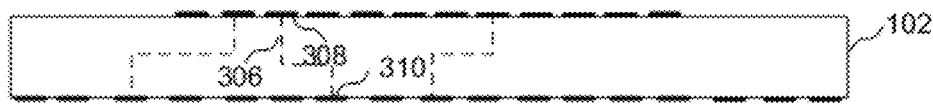
FIG. 6-A
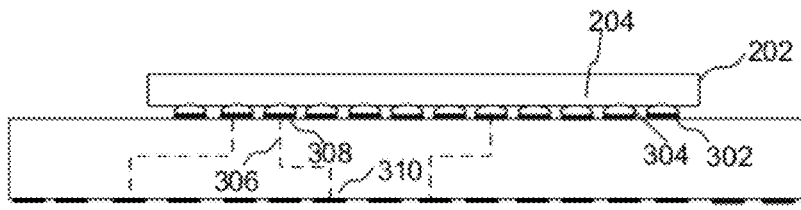
FIG. 6-B
FIG. 6-C
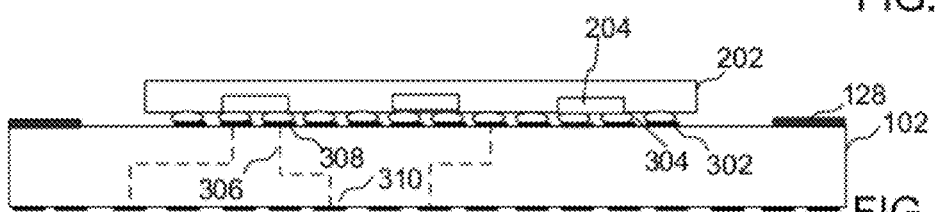
FIG. 6-D
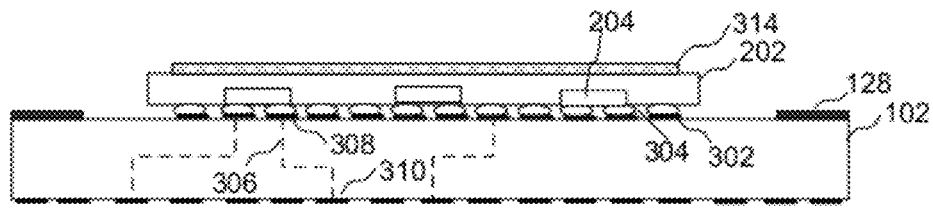
FIG. 6-E
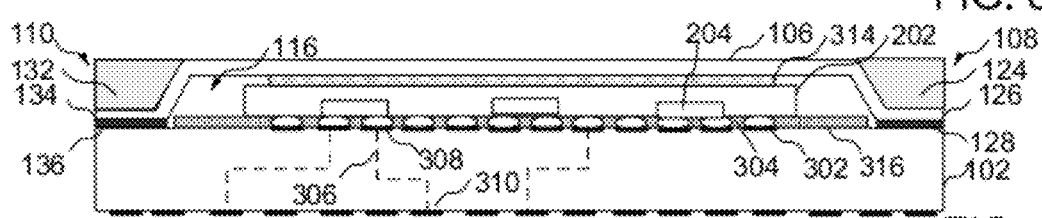
FIG. 6-F
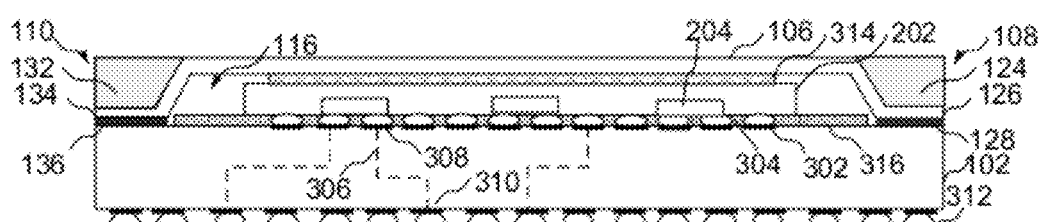
FIG. 6-G

INTEGRATED CIRCUIT PACKAGE AND METHOD OF FORMING AN INTEGRATED CIRCUIT PACKAGE

FIELD OF THE INVENTION

The present invention relates generally to integrated circuit devices, and in particular, to an integrated circuit package and a method of forming an integrated circuit package.

BACKGROUND OF THE INVENTION

An integrated circuit package often has a lid which covers a die and functions as a heat sink. A heat sink is important in maintaining the temperature of the die to ensure that circuits implemented in the die function properly. Integrated circuit packages also have other elements, such as decoupling capacitors, which may help the performance of the circuits implemented in the die. Because alternating current (AC) noise may be superimposed on a direct current (DC) signal which is used to power circuits implemented on the die, decoupling capacitors may be used to reduce or eliminate undesirable noise. Also, decoupling capacitors may be used to prevent spikes in the DC signal. As integrated circuits continue to become more advanced, a greater number of decoupling capacitors may be necessary to implement an integrated circuit device.

However, it can be difficult to attach a heat sink to the substrate without occupying a significant portion of the substrate in an integrated circuit package. Further, the decoupling capacitors take up additional room on the substrate of the integrated circuit package, generally increasing the size of the integrated circuit package for a die of a certain size. Along with the demands for reduced sizes of electronic devices, there is also a demand for reduced sizes of integrated circuit packages.

SUMMARY OF THE INVENTION

An integrated circuit package is described. The integrated circuit package comprises a substrate having a plurality of sides, where each pair of adjacent sides forms a corner; a die coupled to a first surface of the substrate; a lid having a first portion positioned over the die and a plurality of foot portions, each foot portion of the plurality of foot portions being coupled to the first surface of the substrate at a corresponding corner of the substrate, wherein a side of the integrated circuit package above the substrate and between two associated foot portions has an opening; and a plurality of contact elements coupled to a second surface of the substrate.

According to an alternate embodiment, an integrated circuit package comprises a substrate having a plurality of sides, where each pair of adjacent sides forms a corner; a die coupled to a first surface of the substrate; a lid having a first portion positioned over the die and a plurality of foot portions, each foot portion of the plurality of foot portions having a flange which is coupled to the first surface of the substrate at a corresponding corner of the substrate, wherein the lid comprises, for each foot portion, a descending portion having a contoured surface between the first portion and the flange; and a plurality of contact elements coupled to a second surface of the substrate.

A method of forming an integrated circuit package having a lid is also disclosed. The method comprises providing a substrate; coupling a die to a first surface of the substrate; positioning a first portion of a lid over the die; and coupling foot portions of the lid to corners of the substrate, each foot portion having a descending portion extending down from the first portion of the lid to a flange, wherein each descending portion comprises a contoured surface formed between the first portion of the lid and a corresponding flange.

BRIEF DESCRIPTION OF THE DRAWINGS

FIG. 6 is a series of figures showing the formation of an integrated circuit package according to an embodiment of the present invention.

DETAILED DESCRIPTION OF THE DRAWINGS

Figure 1:
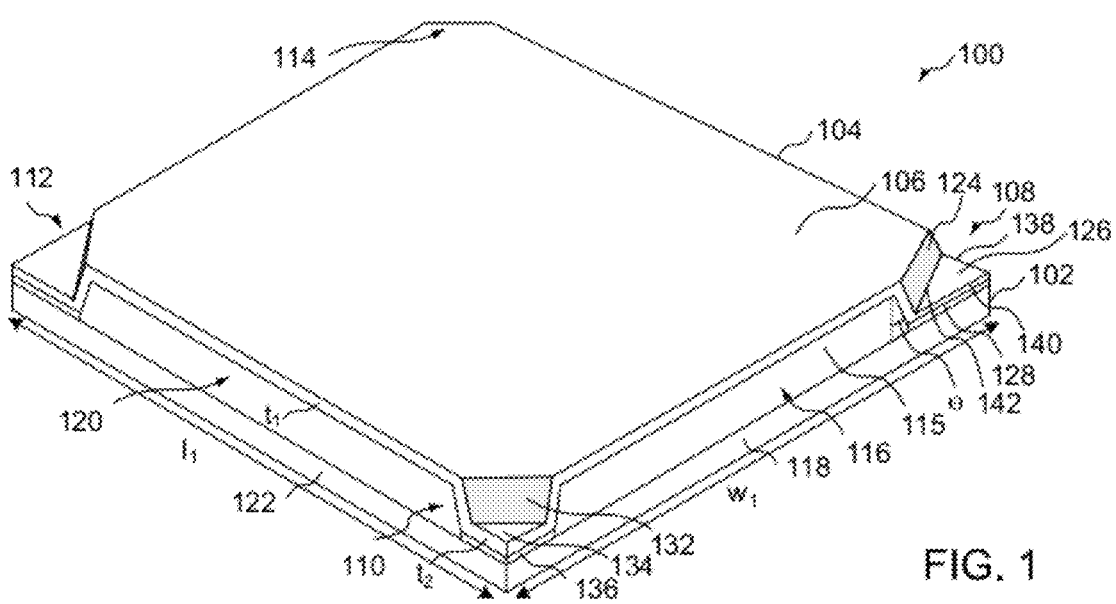
FIG. 1 is a perspective view of an integrated circuit package according to an embodiment of the present invention.

Turning first to FIG. 1, a perspective view of an integrated circuit package according to an embodiment of the present invention is shown. In particular, an integrated circuit package 100 comprises a substrate 102 for receiving a die and a lid 104, where the integrated circuit package has a width $w_1$ and a length $l_1$. The lid comprises a first portion 106 which is a planar surface between sides of the lid and a plurality of foot portions 108-114 on each corner of the lid. As can be seen on one side of the lid, a first surface 115 of the substrate comprises a planar surface for receiving the die. Adjacent sides of the substrate form corners of the substrate.

Also shown in the perspective view of FIG. 1 is an opening 116. That is, unlike at the foot portions, the lid does not extend down to the substrate, but only extends to the edge 118 of the substrate in the plane of the first portion 106. Accordingly, the side of the integrated circuit package has an opening between two adjacent foot portions of the lid. An opening 120 is also shown between foot portions 110 and 112 on a side 122 of the integrated circuit package. According to one embodiment, each side of the integrated circuit package has an opening between any two adjacent foot portions of the lid.

The foot portions are formed to extend down from the first surface 106 and comprise a flange which may be attached to the substrate. For example, the foot portion 108 comprising a descending portion 124 which extends to a flange 126. An bonding agent 128 is also shown between the flange 126 and the first surface 115 of the substrate 102. Similarly, a descending portion 132 of the foot portion 110 extends to a flange 134 which extends over a bonding agent 136. The edges between the first portion 104 of the lid and the descending portion and between the descending portion and the flange generally comprise linear edges. The bonding agents may comprise any material which would enable the foot portion to be attached to the substrate, such as an adhesive material or a solder material, for example.

The descending portion may extend vertically down from the first surface, or may be slanted at a predetermined angle theta, as shown in FIG. 1. The angle may be chosen to provide both the strength and flexibility necessary for a placement machine to attach the lid to the substrate. That is, the lid is preferably formed to prevent the flange portions from being lifted from the substrate as a result of the clamping pressure of the lid during the assembly process. According to one embodiment, the descending portion may be at an angle theta of approximately 54 degrees from the vertical, with a rise of approximately 0.725 millimeters (mm) and a run of approximately 1.0 mm. Each flange according to the embodiment of FIG. 1 comprises a triangular flange formed by a first side edge 138 and a second side edge 140 which meet in a corner of the lid, and an edge 142 formed between the descending portion 124 and the flange 126.

Figure 2:
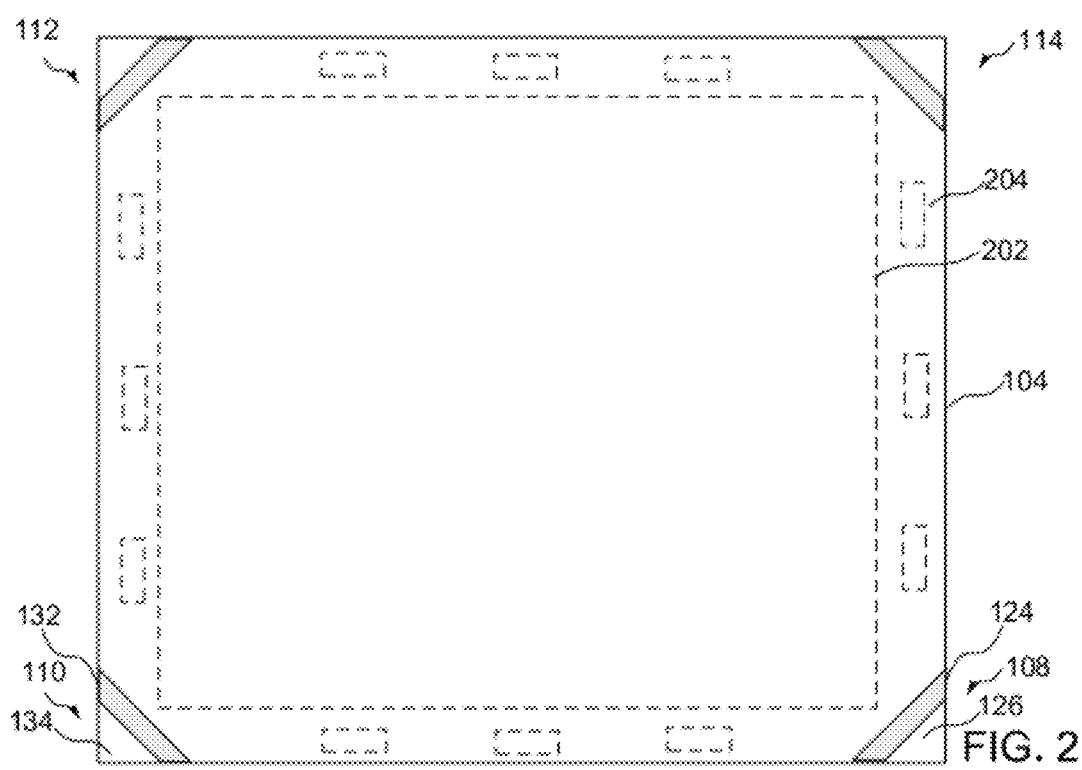
FIG. 2 is a top plan view of the integrated circuit package of FIG. 1.

The locations of the die 202 and decoupling capacitors 204 under the lid 104 are shown in dotted lines in FIG. 2. As can be seen in FIG. 2, more space is available for the decoupling capacitors by leaving the sides of the integrated circuit package open. That is, if the lid were to extend downward from the first portion 106 and a flange which were to extend along the entire width of the substrate, the decoupling capacitors could not be placed as close to the end of the substrate. As a result, the substrate would have to be made larger to accommodate the same size die.

Figure 3:
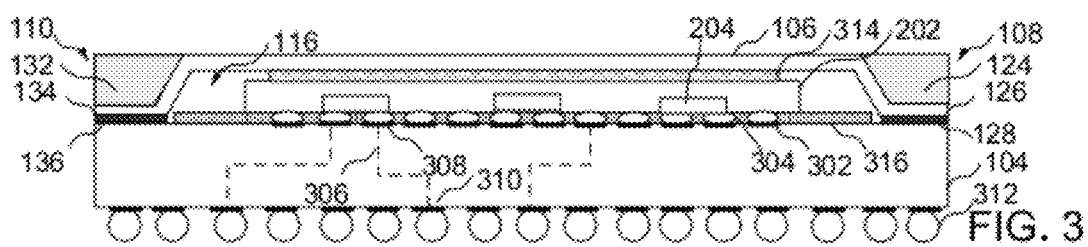
FIG. 3 is a side view of an integrated circuit package according to an embodiment of the present invention.

The die and the decoupling capacitors are shown more clearly in the side view of the integrated circuit package of FIG. 3. In particular, the die 202 and the decoupling capacitors 204 are shown coupled to contact pads 302 of the substrate by solder bumps 304 of the die. The substrate also comprises interconnect elements, such as an interconnect element 306 coupled between a contact pad 308 on the top surface of the substrate to a corresponding contact pad 310 on a bottom surface of the substrate. The interconnect elements may be implemented using metal traces associated with a number of metal layers separated by dielectric layers and vias connecting metal traces through the dielectric layers, as is well known in the art.

Contact elements, such as solder balls 312, are provided on the contact pads on a second surface comprising the bottom surface of the substrate to enable the attachment of the integrated circuit package to another element, such as a printed circuit board. Although a flip-chip die package is shown in FIG. 3, the lid of the present invention could be attached to a substrate having a die attached to the substrate by wire bonds. Further, while the substrate has solder balls for attachment to a printed circuit board, the lid of the present invention could be used with a substrate having some other contact arrangement, such as a substrate having contact leads extending from the substrate. For example, the lid may be associated with a lead frame package, where the contact elements comprise leads which may extend a side other than the bottom. For example, the leads may extend from sides of the substrate. Finally, the integrated circuit package may include a bonding agent 314 for bonding the first portion of the lid to the die and an underfill 316. The bonding agent 314 may comprise an adhesive material or a solder material, where the bonding agent 314 and the bonding agent 128 may comprise the same material or a different material. While one corner of the lid is described in detail, it should be understood that all corners of the lid are preferably the same. The lid 104 and the bonding agent 314 may function as a heat sink.

Figure 4:
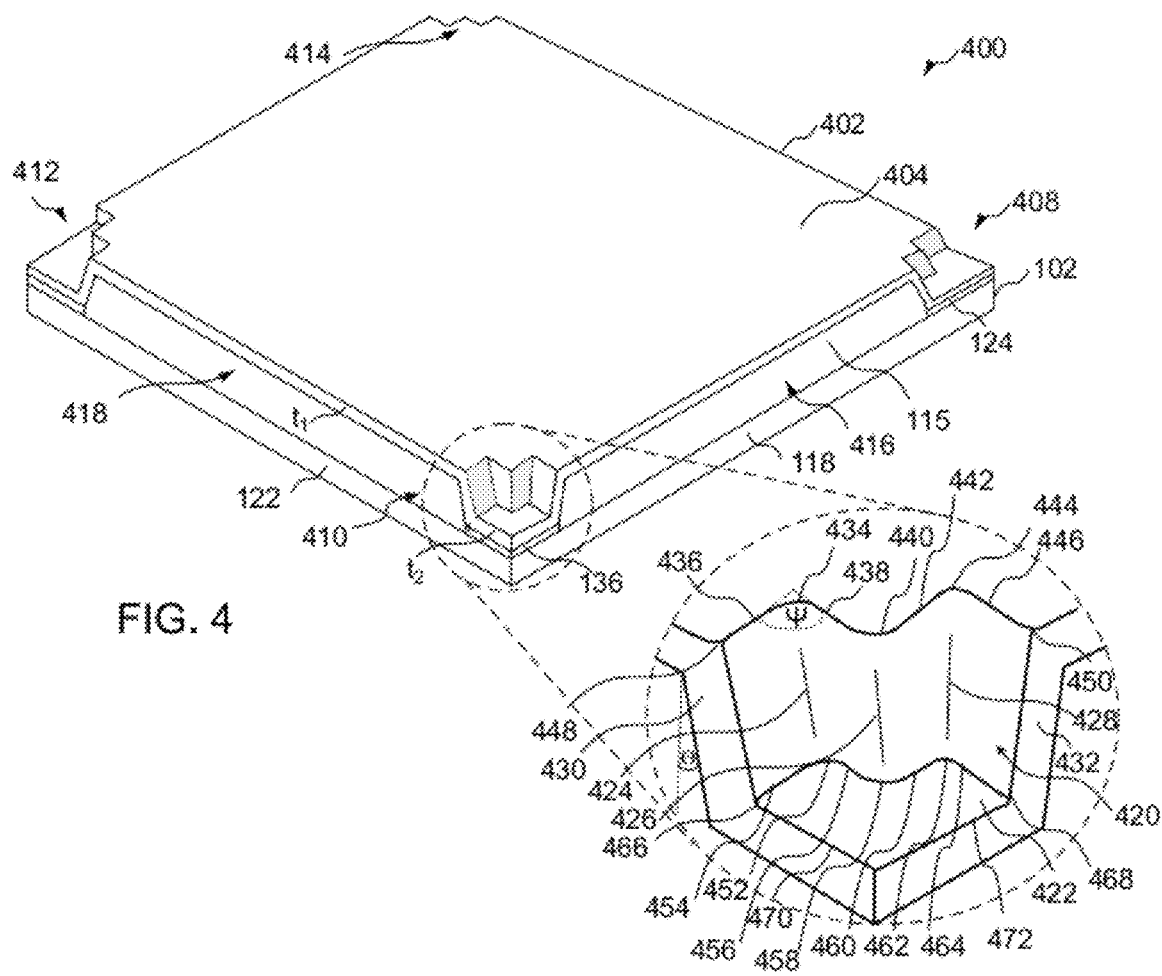
FIG. 4 is a perspective view of an integrated circuit package according to an alternate embodiment of the present invention.
Figure 5:
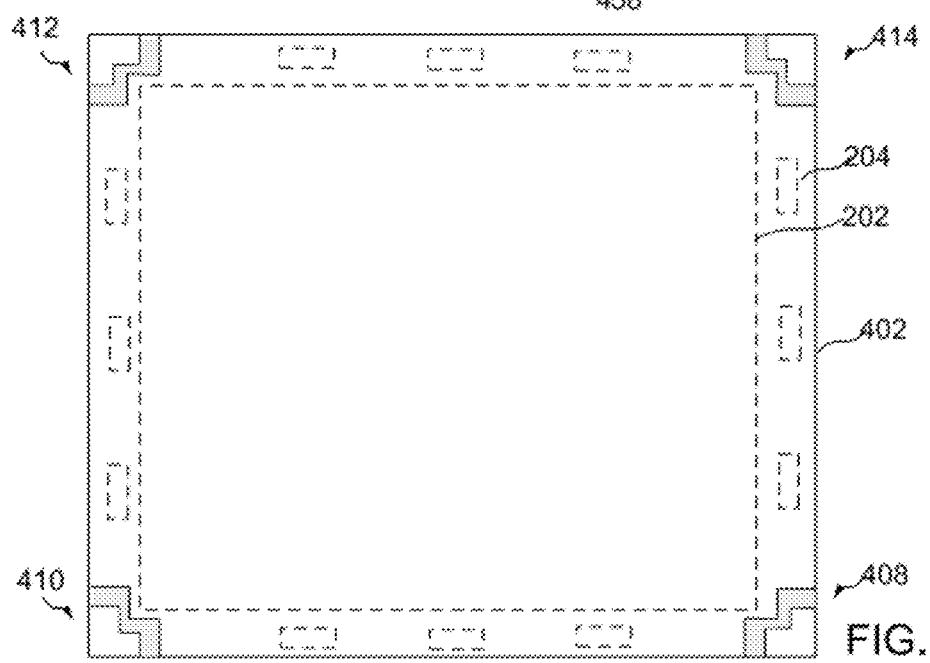
FIG. 5 is a top plan view of the integrated circuit package of FIG. 4.

Turning now to FIGS. 4 and 5, a perspective view and top plan view of an integrated circuit package according to an alternate embodiment of the present invention is shown. In FIG. 4, the corners comprise contoured descending portions to, e.g., improve the strength of the lid. According to the embodiment of FIG. 4, the lid 402 comprises a first portion 404 having a flat planar portion which extends to the four corners 408, 410, 412, and 414, where each of the corners may be identical. As can be seen in FIG. 4, there are openings on the sides of the lid as described above in reference to FIG. 1.

An enlarged view of the corner 410 shows more detail according to one embodiment of the contoured corners of the embodiment of FIG. 4. In particular, the foot portion 410 comprises a contoured descending portion 420 which extends to a flange 422. The contoured descending portion 420 comprises a plurality of inflection points, including inflection points 424, 426 and 428, extending between a side 430 and a side 432 of the foot portion. The inflection points indicate where the contoured descending portion changes direction between a generally planar surface extending in a first direction to a generally planar surface extending in a second direction. The edge between the first portion 404 and the contoured descending portion 420 and the edge between the contoured descending portion 420 and the flange 422 also follow the shape of the contoured descending portion, where the arc of the edges generally correspond to the arc of the inflection points. According to the embodiment of FIG. 4, the contoured descending portion 420 comprises an angular-type surface, and the edges of the descending portion comprise angular-type edges.

More particularly, the edge between the first portion 404 and the contoured descending portion 420 comprises a first corner 434 between a linear portion 436 and a linear portion 438, a second corner 440 between the linear portion 438 and a linear portion 442, and a third corner 444 between the linear portion 442 and a linear portion 446. The linear portion 436 extends to a fourth corner 448, while the linear portion 446 extends to a fifth corner 450. Similarly, the edge between the contoured descending portion 420 and the flange 422 comprises a sixth corner 452 between a linear portion 544 and a linear portion 456, a seventh corner 458 between the linear portion 546 and a linear portion 460, and an eighth corner 462 between the linear portion 460 and a linear portion 464. The linear portion 454 extends to a ninth corner 466, while the linear portion 464 extends to a tenth corner 468.

The contoured edge of the contoured descending portion at the flange along with a first side edge 470 and a second side edge 472 of the flange form a contoured flange. According to one embodiment, any two adjacent linear portions of the edge of the descending portion at the flange have an angle psi (shown by way of example for the first corner 434) at 90 degrees, forming a first angular-type flange. Alternatively, the angle psi for each of the corners of the edge of the descending portion at the flange could be greater than 90 degrees, forming a second angular-type flange.

The contoured descending portion 420 and the edges at the top and bottom of the contoured descending portion generally from a zigzag arrangement having a predetermined angle between adjacent linear portions. Although the corners at the edges in the planes of the first portion 404 and the flange 422 could be corners formed at 90 degrees angles with no curvature where two adjacent linear portions meet, the corners are preferably formed to have some curvature to avoid any breaking of the material during the formation of the lid. For example, the lid may comprise a formable metal material which may be stamped to the shape shown in FIG. 1 or 4. Accordingly, an angular-type flange may comprise an edge having rounded corners where the linear portions meet. Further, the inflection points of the descending portion may also comprise planes which meet at edges comprising the inflection points or at curved portions comprising the inflection points.

According to one embodiment, the lid may comprise a Nickel-plated Copper, and may have a thickness $t_1$ of approximately 0.45+/−0.10 mm, where the Nickel plating may be electrolytic plating of a minimum thickness of approximately 1.0 micrometers (μm). If the original piece of metal from which the resulting stamped lid is formed is a piece of metal having a dimension of $l_1 \times w_1$, the metal in the area of the corners will generally become thinner when forming the foot portions, and may have a thickness $t_2$ which is less than $t_1$. That is, to enable the formation of the additional area of the lid comprising the descending portion, the metal in the corner is generally spread out during the forming process, and therefore will become thinner in the corners. If the corners are formed at 90 degree angles without any curvatures in the corners, there may be cracking in the metal at the corners. By providing rounded corners, the metal is less likely to crack during the stamping operation.

Alternatively, a metal sheet may have enlarged corners portions before the forming operation which would allow the descending portions to be formed with reduced stress on the metal. In such a case of a metal sheet having enlarged corners, the flange and the edges of the corner may need to be trimmed to provide the proper shape. While the embodiment of FIG. 4 shows three points of inflection, additional points of inflection may be used. Similarly, methods other than a stamping process may be used to form the lids. For example, the lids may be formed by a molding process.

Turning now to FIG. 6, a series of figures show the formation of an integrated circuit package according to an embodiment of the present invention. In particular, after a substrate is provided in FIG. 6-A, the die 202 and the decoupling capacitors 204 are coupled to the die as shown in FIGS. 6-B and 6-C, respectively. The die and the decoupling capacitors may be soldered to the contacts pads on the top of the substrate by a solder material. The solder material may be solder bumps on the die and decoupling capacitors. A bonding agent is then placed in the corners, as shown in FIG. 6-D. The bonding agent may be an adhesive material or a solder, for example. A bonding agent may optionally be applied to the top of the die, as shown in FIG. 6-E. The bonding agent applied to the die may be the same as the bonding agent used between the foot portions of the lid and the substrate, or it may be different. After the lid is attached as shown in FIG. 6-F, the solder balls 312 are applied to contact pads on the bottom of the substrate as shown in FIG. 6-G. Although particular steps of forming a particular integrated circuit package are shown in FIG. 6, it should be understood that additional steps may be implemented, and the method may be used to form a different integrated circuit package.

Figure 7:
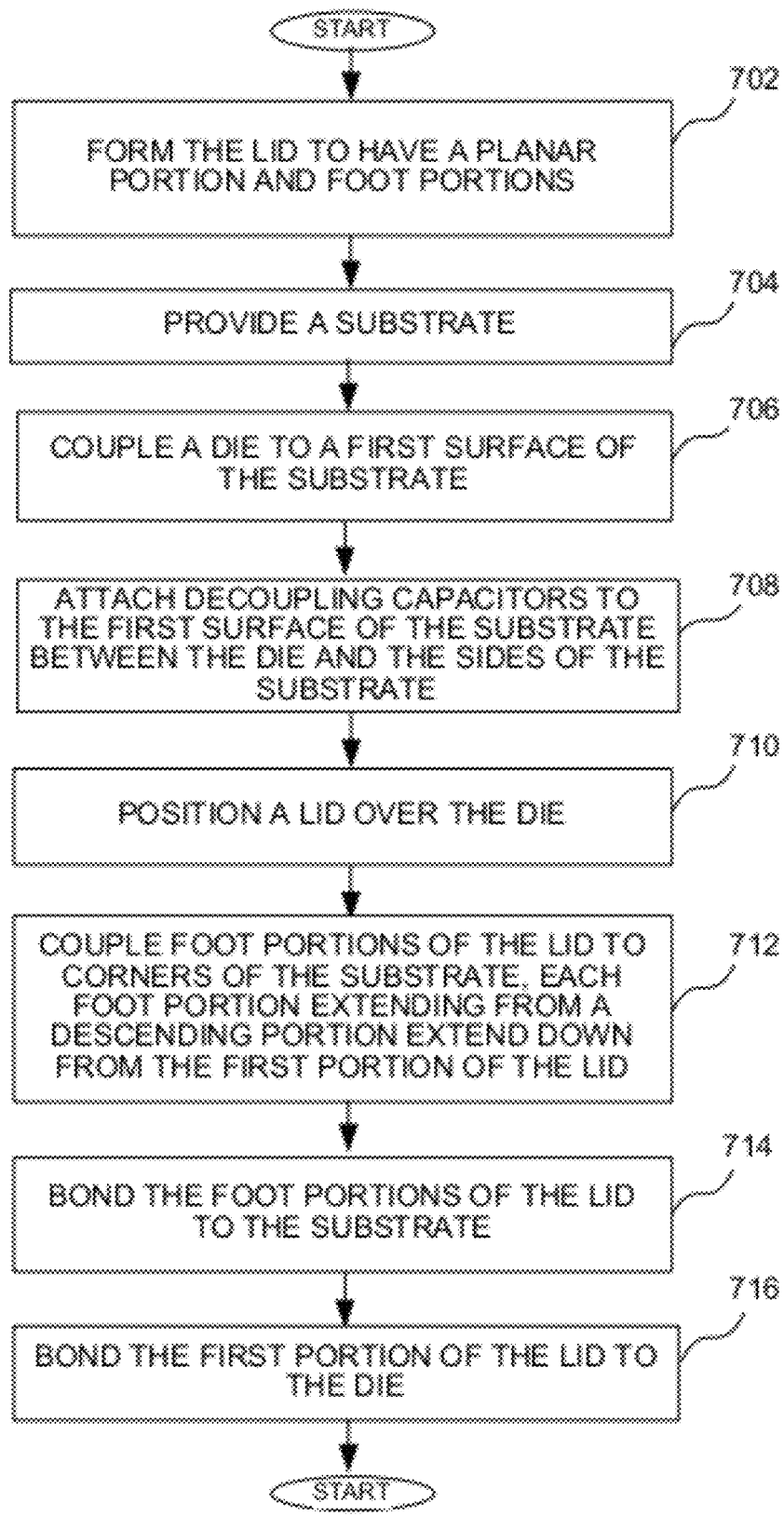
FIG. 7 is a flow chart showing a method of forming an integrated circuit package according to an embodiment of the present invention.

Finally, turning to FIG. 7, a flow chart shows a method of forming an integrated circuit package according to an embodiment of the present invention. In particular, a lid is formed to have a planar portion and foot portions at a step 702. The lid may be formed using a stamping or molding process, as set forth above, or some other suitable process. A substrate is provided at a step 704. A die is coupled to a first surface of the substrate at a step 706. Decoupling capacitors are attached to the first surface of the substrate between the die and the side of the substrate at a step 708. A lid is positioned over the die at a step 710. Foot portions of the lid are coupled to corners of the substrate, where each foot portion comprises a descending portion extending down from the planar portion of the lid at a step 712. Each of the descending portions may comprise a contoured surface formed between the planar portion and a corresponding flange. The foot portions of the lid are bonded to the substrate at a step 714. The planar portion of the lid may also be bonded to the die at a step 716. The steps of FIG. 7 may be performed using any of the integrated circuit packages of FIGS. 1-6 as described, or other integrated circuit packages which may enable the method as described.

It can therefore be appreciated that the new and novel integrated circuit package and method of forming an integrated circuit package has been described. It will be appreciated by those skilled in the art that numerous alternatives and equivalents will be seen to exist which incorporate the disclosed invention. As a result, the invention is not to be limited by the foregoing embodiments, but only by the following claims.

We claim:

1. An integrated circuit package comprising:
a substrate having a plurality of sides, where each pair of adjacent sides forms a corner;
a die coupled to a first surface of the substrate;
a lid having a first portion positioned over the die and a plurality of foot portions, each foot portion of the plurality of foot portions being coupled to the first surface of the substrate at a corresponding corner of the substrate, wherein a side of the integrated circuit package above the substrate and between two associated foot portions has an opening at a side of the lid extending from the first portion of the lid to the first surface of the substrate; and
a plurality of contact elements coupled to a second surface of the substrate.

2. The integrated circuit package of claim 1, wherein each foot portion of the plurality of foot portions comprises a descending portion extending from the first portion of the lid to a flange.

3. The integrated circuit package of claim 2, further comprising a bonding agent between the flange of each foot portion and the first surface of the substrate.

4. The integrated circuit package of claim 2, wherein the lid comprises, for each foot portion, a linear edge formed between the first portion and the descending portion and the flange comprises a triangular flange.

5. The integrated circuit package of claim 2, wherein the lid comprises, for each foot portion, a contoured edge between the descending portion and the flange.

6. The integrated circuit package of claim 5, wherein the contoured edge comprises an angular-type edge having linear portions and angles between adjacent portions which are greater than ninety degrees.

7. The integrated circuit package of claim 5, wherein the contoured edge comprises rounded corners.

8. An integrated circuit package comprising:
a substrate having a plurality of sides, where each pair of adjacent sides forms a corner;
a die coupled to a first surface of the substrate;
a lid having a first portion positioned over the die and a plurality of foot portions, each foot portion of the plurality of foot portions having a flange which is coupled to the first surface of the substrate at a corresponding corner of the substrate, wherein the lid comprises, for each foot portion, a descending portion having a contoured surface extending between a first side and a second side of the descending portion, wherein the first side of the descending portion extends between the first portion of the lid and the flange at a first side of the first portion of the lid, and the second side of the descending portion extends between the first portion of the lid and the flange at a second side of the first portion of the lid which is adjacent to the first side of the first portion of the lid; and
a plurality of contact elements coupled to a second surface of the substrate.

9. The integrated circuit package of claim 8, wherein a side of the integrated circuit package above the substrate and between two associated foot portions has an opening.

10. The integrated circuit package of claim 9, further comprising decoupling capacitors below the first portion of the lid between the die and the opening.

11. The integrated circuit package of claim 8, wherein, for each foot portion, the contoured surface comprises an angular-type surface.

12. The integrated circuit package of claim 11, wherein, for each foot portion, an edge between the contoured surface and the flange comprises an angular-type edge having linear portions and angles between adjacent linear portions which are greater than ninety degrees.

13. The integrated circuit package of claim 8, further comprising a bonding agent between each flange of the plurality of foot portions and the first surface of the substrate.

14. The integrated circuit package of claim 8, further comprising a bonding agent between the first surface of the lid and the die, wherein the lid and the bonding agent between the first surface of the lid and the die comprise a heat sink.

15. A method of forming an integrated circuit package having a lid, the method comprising:
 providing a substrate having a plurality of sides, where each pair of adjacent sides forms a corner;
 coupling a die to a first surface of the substrate;
 positioning a first portion of a lid over the die; coupling flanges of foot portions of the lid to corresponding corners of the substrate, each foot portion having a descending portion extending down from the first portion of the lid to a flange, wherein each descending portion comprises a contoured surface extending between a first side and a second side of the descending portion, wherein the first side of the descending portion extends between the first portion of the lid and a corresponding flange at a first side of the first portion of the lid, and the second side of the descending portion extends between the first portion of the lid and the flange at a second side of the first portion of the lid which is adjacent to the first side of the first portion of the lid; and
 coupling a plurality of contact elements to a second surface of the substrate.

16. The method of claim 15, further comprising forming the lid to have the first portion and the foot portions.

17. The method of claim 15, wherein positioning a first portion of the lid over the die comprises providing an opening on a side of the integrated circuit package between two adjacent foot portions.

18. The method of claim 17, further comprising attaching decoupling capacitors to the first surface of the substrate between the die and the opening.

19. The method of claim 15, further comprising bonding the flanges of the foot portions of the lid to the first surface of the substrate.

20. The method of claim 15, further comprising bonding the first portion of the lid to the die.

* * * * *